(12) United States Patent
Cheng et al.

(10) Patent No.: US 11,258,241 B1
(45) Date of Patent: Feb. 22, 2022

(54) CABLE MANAGEMENT DEVICE AND CABLE MANAGEMENT FRAME

(71) Applicant: HONGFUJIN PRECISION ELECTRONICS(TIANJIN)CO., LTD., Tianjin (CN)

(72) Inventors: Yen-Lu Cheng, New Taipei (TW); Hsueh-Chin Lu, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 17/033,844

(22) Filed: Sep. 27, 2020

(30) Foreign Application Priority Data

Aug. 19, 2020 (CN) .......................... 202010839160.0

(51) Int. Cl.
*H02G 3/04* (2006.01)
*H05K 7/14* (2006.01)

(52) U.S. Cl.
CPC ......... *H02G 3/0456* (2013.01); *H05K 7/1491* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,921,402 A * | 7/1999 | Magenheimer | .......... | H04Q 1/06 211/26 |
| 6,489,565 B1 * | 12/2002 | Krietzman | ............ | H02G 3/045 174/101 |
| 6,539,161 B2 * | 3/2003 | Holman | ............... | G02B 6/4452 385/136 |
| 6,629,675 B1 * | 10/2003 | Bjorklund | ................ | H02G 3/30 248/49 |
| 6,946,605 B2 * | 9/2005 | Levesque | ............. | H02G 3/0493 174/100 |
| 7,022,916 B1 * | 4/2006 | Cavanaugh | .......... | H05K 7/1491 174/100 |
| 7,734,139 B2 * | 6/2010 | Rector, III | ........... | G02B 6/4471 385/136 |
| 7,963,486 B2 * | 6/2011 | Wilson | ................... | H04Q 1/062 248/49 |
| 8,558,113 B2 * | 10/2013 | Krietzman | ........... | H02G 3/0475 174/72 A |
| 9,363,922 B2 * | 6/2016 | Larsen | ..................... | H05K 7/18 |
| 10,076,054 B2 * | 9/2018 | Goergen | ............. | H05K 7/1491 |
| 10,320,163 B2 * | 6/2019 | Krietzman | ........... | H02G 3/0608 |
| 10,342,155 B2 * | 7/2019 | Wang | ..................... | H05K 7/186 |
| 10,944,355 B2 * | 3/2021 | Jette | ........................ | F16L 3/14 |
| 2011/0180314 A1 * | 7/2011 | Pedoeem | ............. | H05K 9/0018 174/377 |

FOREIGN PATENT DOCUMENTS

TW        M423987 U1      3/2012

* cited by examiner

*Primary Examiner* — Monica E Millner
(74) *Attorney, Agent, or Firm* — ScienBiziP, P.C.

(57) ABSTRACT

A cable management frame includes a main body, a bracket installed on the main body, a hook installed on the main body, and a pressing member located on an end of the main body. The hook and the bracket are located respectively on two sides of the main body. The hook includes a reinforcing rib coupled to the main body.

14 Claims, 5 Drawing Sheets

CABLE MANAGEMENT DEVICE AND CABLE MANAGEMENT FRAME

FIELD

The subject matter herein generally relates to a cable management device, and more particularly to a cable management device including a cable management frame.

BACKGROUND

Network cable bundles usually need to be organized by a cable management frame in a cabinet. However, the network cable bundles are heavy and are directly supported on a cable management frame, which makes it inconvenient to disassemble and assemble.

BRIEF DESCRIPTION OF THE DRAWINGS

Implementations of the present disclosure will now be described, by way of embodiments, with reference to the attached figures.

DETAILED DESCRIPTION

Figure 1:
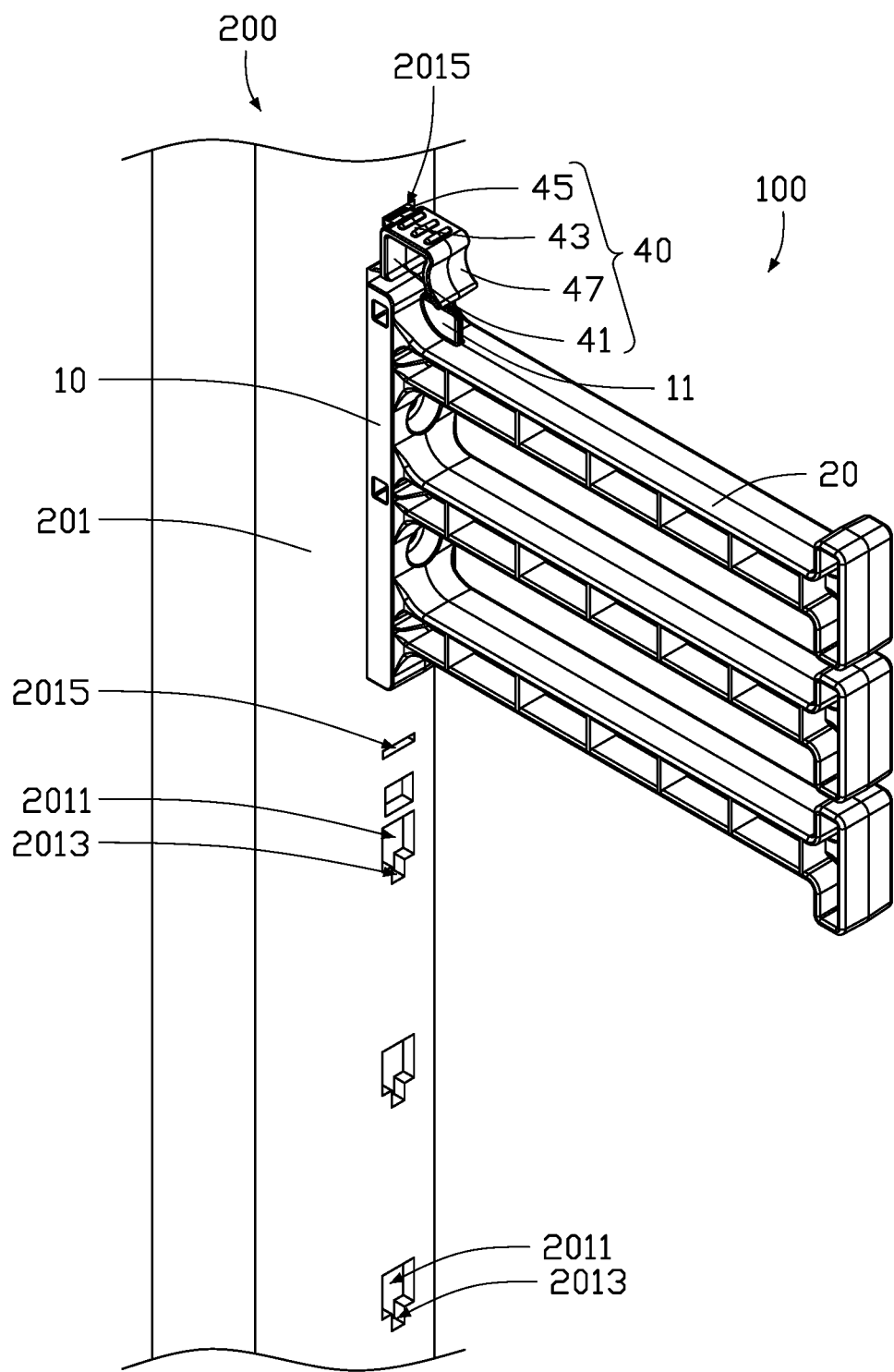
FIG. 1 is a schematic perspective diagram of a cable management device according to an embodiment of the application.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 2:
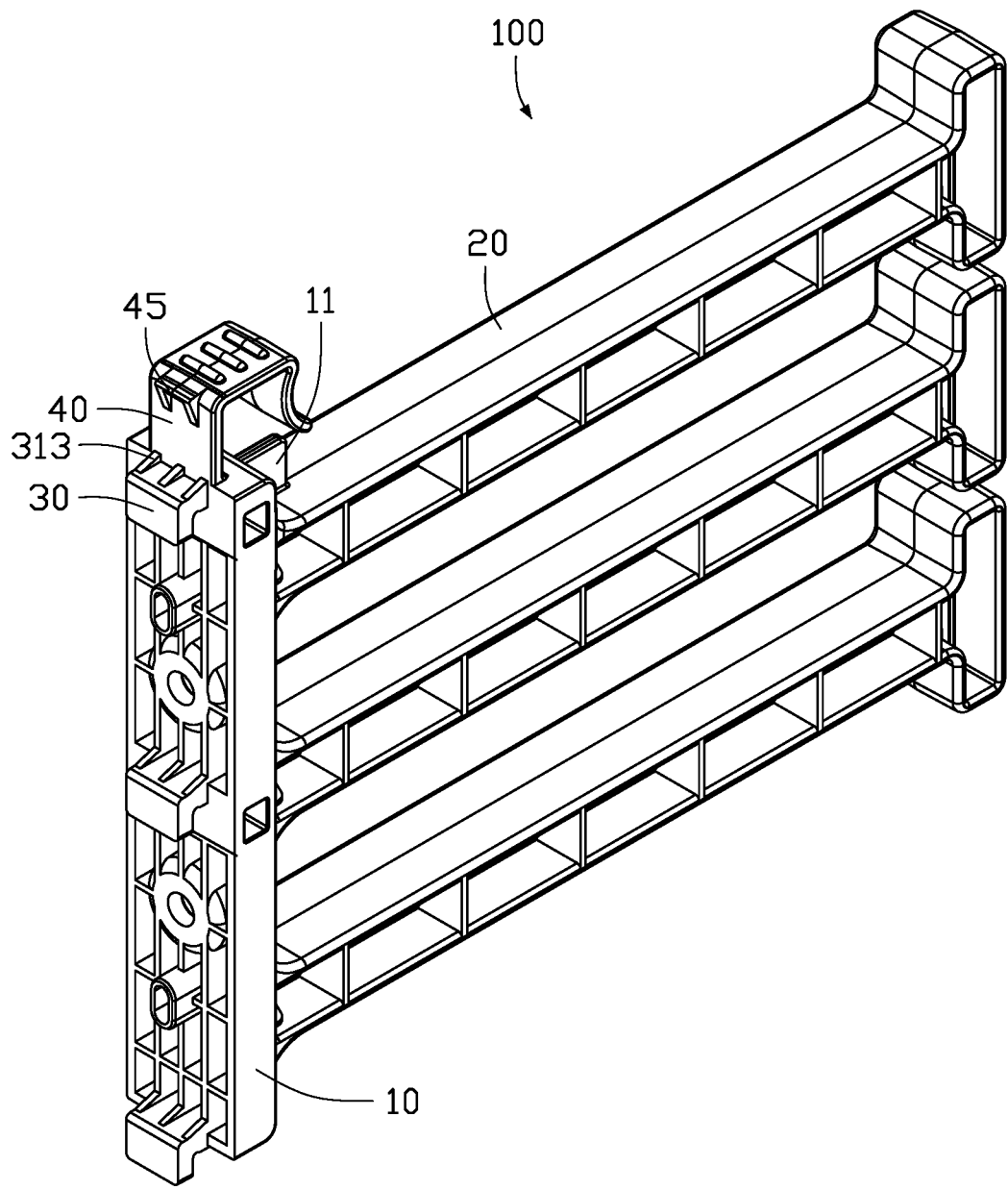
FIG. 2 is a schematic perspective diagram of a cable management frame in the cable management device shown in FIG. 1.

FIG. 1 and FIG. 2 show an embodiment of a cable management device 200. The cable management device 200 is used to organize wiring harnesses (not shown). The cable management device 200 includes a support frame 201 and a cable management frame 100. The cable management frame 100 is installed on the support frame 201. The cable management frame 100 includes a main body 10, a bracket 20, a hook 30, and a pressing member 40. A number of the brackets 20 is a plurality, and a number of the hooks 30 is a plurality. For example, there are three brackets 20 and three hooks 30, but there may be more or less in other embodiments. The brackets 20 are arranged on the main body 10 at intervals. The bracket 20 is used to support and arrange a wire harness. The hooks 30 are arranged on the main body 10 at intervals. The hooks 30 and the brackets 20 are respectively located on opposite sides of the main body 10. The hook 30 is used to couple to the support frame 201. Specifically, the support frame 201 defines a plurality of first engaging holes 2011. The hooks 30 are clamped in the first engaging holes 2011, thereby fixedly mounting the cable management frame 100 on the support frame 201. In order to improve the structural strength of the cable management frame 100, a reinforcing rib 31 is provided on the hook 30. The reinforcing rib 31 is coupled to the main body 10. The support frame 201 defines a plurality of clearance holes 2013. Each clearance hole 2013 communicates with a corresponding one of the first engaging holes 2011 to accommodate the reinforcing rib 31. The pressing member 40 is located at one end of the main body 10, and the pressing member 40 is lifted or pushed to disassemble or install the cable management frame 100 on the support frame 201, so as to facilitate disassembly and assembly.

When installing the cable management frame 100 on the support frame 201, the hook 30 is aligned with the first engaging hole 2011, and the reinforcing rib 31 is aligned with the clearance hole 2013, and then the pressing member 40 is pushed to hold the hook 30 in the first engaging hole 2011 and the reinforcing rib 31 in the clearance hole 2013, thereby completing the installation of the cable management frame 100. When detaching the cable management frame 100, the pressing member 40 is lifted so that the hook 30 can slide along the first engaging hole 2011 and detach from the first engaging hole 2011, thereby detaching the cable management frame 100 from the support frame 201.

The cable management frame 100 is provided with the pressing member 40, and the installation and disassembly of the cable management frame 100 can be completed by only pulling or pushing the pressing member 40, so that the cable management frame 100 is convenient to disassemble and assemble. The cable management frame 100 utilizes the hook 30 provided with the reinforcing rib 31, and the reinforcing rib 31 is coupled to the main body 10, so that the main body 10 of the cable management frame 100 is firmly installed on the support frame 201, thereby improving the overall performance and support strength of the cable management frame 100.

The hook 30 includes an extension portion 33 and a first holding portion 35. One end of the extension portion 33 is located on the main body 10, and another end of the extension portion 33 extends away from the main body 10. The first holding portion 35 extends from the end of the extension portion 33 away from the main body 10. The first holding portion 35 can pass through the first engaging hole 2011, and when the main body 10 slides along the support frame 201, the first holding portion 35 is held by the support frame 201 in the first engaging hole 2011.

Figure 3:
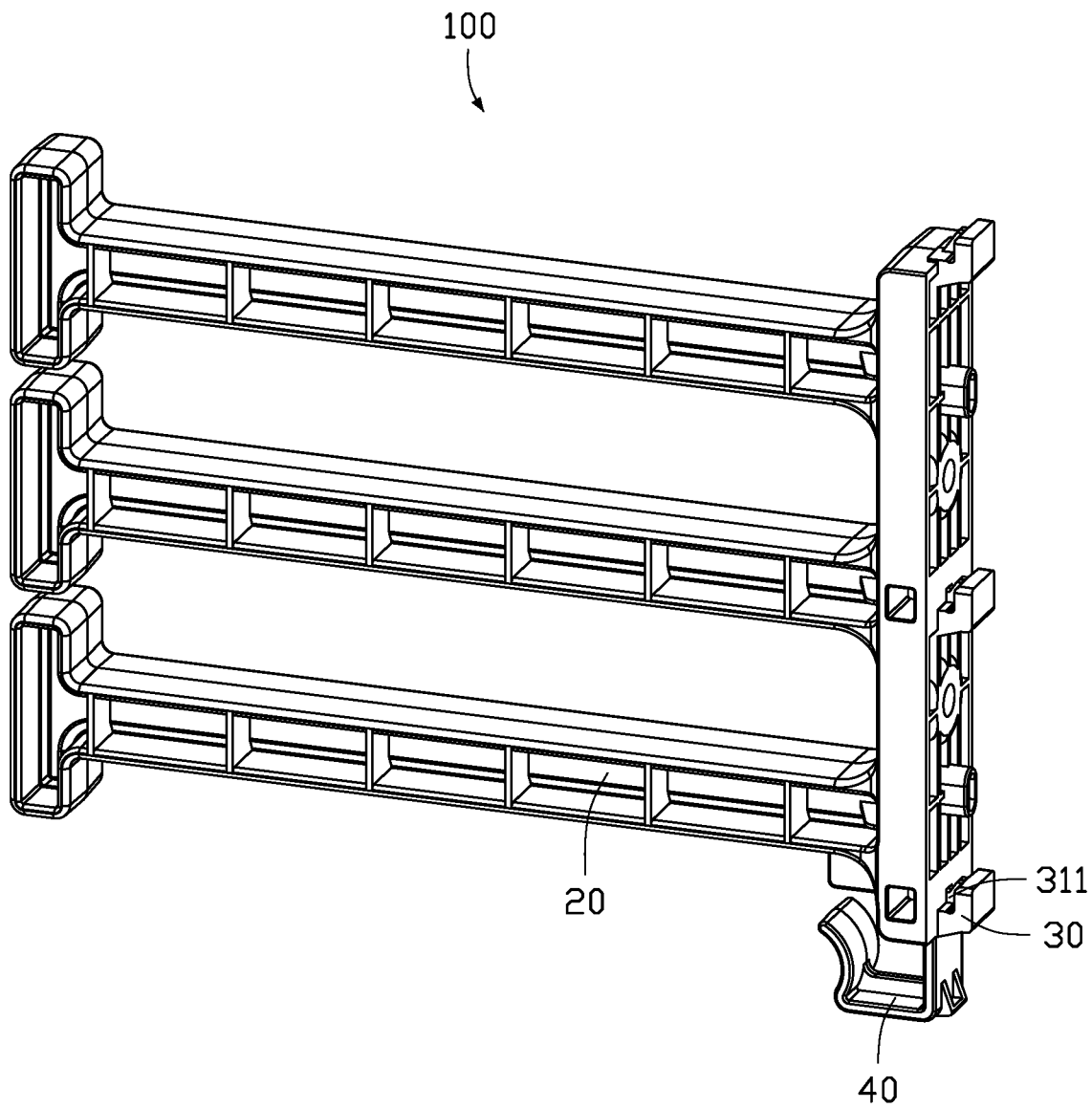
FIG. 3 is similar to FIG. 2, but showing the cable management frame from another perspective.
Figure 4:
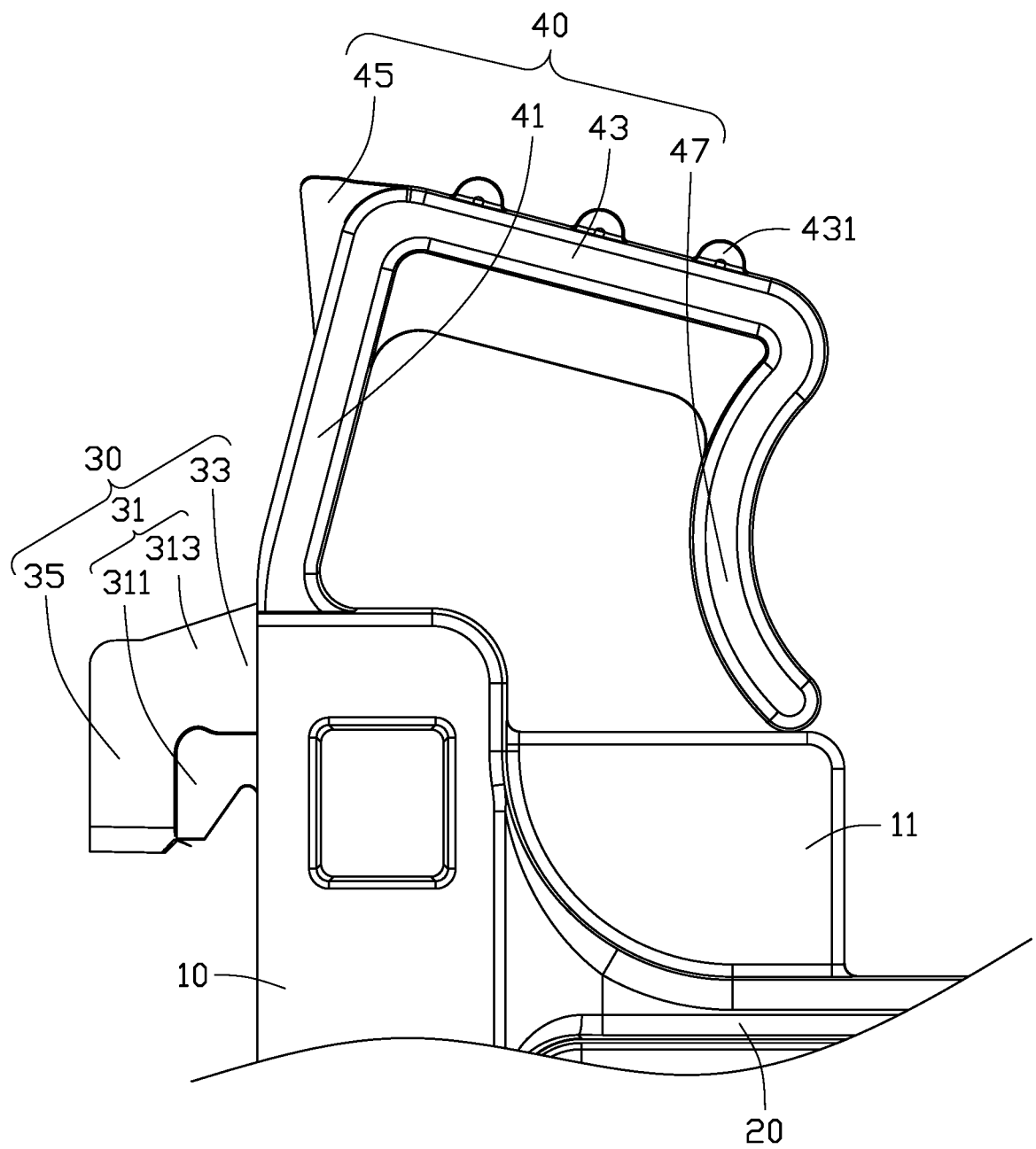
FIG. 4 is a schematic diagram of a portion of the cable management frame shown in FIG. 2.

Referring to FIGS. 3 and 4, the reinforcing rib 31 includes a first rib 311. The first rib 311 is coupled to the extension portion 33, the first holding portion 35, and the main body 10 to improve the strength of the cable management frame 100. A projected area of the first rib 311 on the main body 10 is smaller than a projected area of the first holding portion 35 on the main body 10, so that a portion of the first holding portion 35 that is not coupled to the first rib 311 is held by the first engaging hole 2011. In one embodiment, the first rib 311 is located at a symmetric center of the first holding portion 35, so that a clamping force of the first holding portion 35 on the support frame 201 is uniform. It can be understood that, in other embodiments, a number of the first rib 311 may be a plurality, such that the plurality of first ribs 311 is arranged symmetrically or asymmetrically on the first holding portion 35. Accordingly, a number of the clearance holes 2013 is a plurality, and the plurality of clearance holes 2013 correspond in position to the plurality of first ribs 311.

Referring to FIG. 2, the reinforcing rib 31 further includes a plurality of second ribs 313. The plurality of second ribs 313 is symmetrically arranged on a side of the extension portion 33 away from the first rib 311 and coupled to the main body 10. The second ribs 313 further strengthen a clamping strength of the hook 30 on the support frame 201. It can be understood that in other embodiments, the second ribs 313 may also be omitted.

Referring to FIGS. 1 and 4, the pressing member 40 includes a deforming portion 41 and a pressing portion 43. The deforming portion 41 is located at one end of the main body 10 and extends in a direction parallel to the main body 10. The pressing portion 43 is located on the deforming portion 41 and extends to a side of the deforming portion 41 away from the hook 30. The deforming portion 41 can be elastically deformed. The pressing member 40 is provided with a second holding portion 45 facing the support frame 201. Specifically, the second holding portion 45 is provided on a side of the deforming portion 41 facing the support frame 201. The support frame 201 defines a second engaging hole 2015. The second holding portion 45 can be clamped in the second engaging hole 2015. The first holding portion 35 of the hook 30 is clamped in the first engaging hole 2011, and the second holding portion 45 of the pressing member 40 is clamped in the second engaging hole 2015, so that the cable management frame 100 is fixed on the support frame 201. It can be understood that in other embodiments, the second holding portion 45 may be omitted.

When the pressing portion 43 is pressed, the pressing portion 43 can drive the deforming portion 41 to move away from the hook 30. In order to prevent the pressing portion 43 from pressing at a large angle and causing the deforming portion 41 to be excessively deformed and damaged, the pressing member 40 further includes a stopping portion 47. The stopping portion 47 is located on the pressing portion 43 and extends to one side of the pressing portion 43. A protruding portion 11 is provided on a side of the main body 10 facing away from the hook 30. When the deforming portion 41 is deformed, the stopping portion 47 is stopped by the protruding portion 11 to limit a deformation range of the deforming portion 41. It can be understood that in other embodiments, the stopping portion 47 may be omitted.

In order to make the pressing portion 43 reliable and convenient, a plurality of protrusions 431 for increasing friction are provided on the pressing portion 43. It can be understood that in other embodiments, the protrusions 431 may be omitted.

In one embodiment, a plurality of cable management frames 100 is installed on the support frame 201. In one embodiment, the number of brackets 20 of each cable management frame 100 is three, and the number of hooks 30 of each cable management frame 100 is three.

Figure 5:
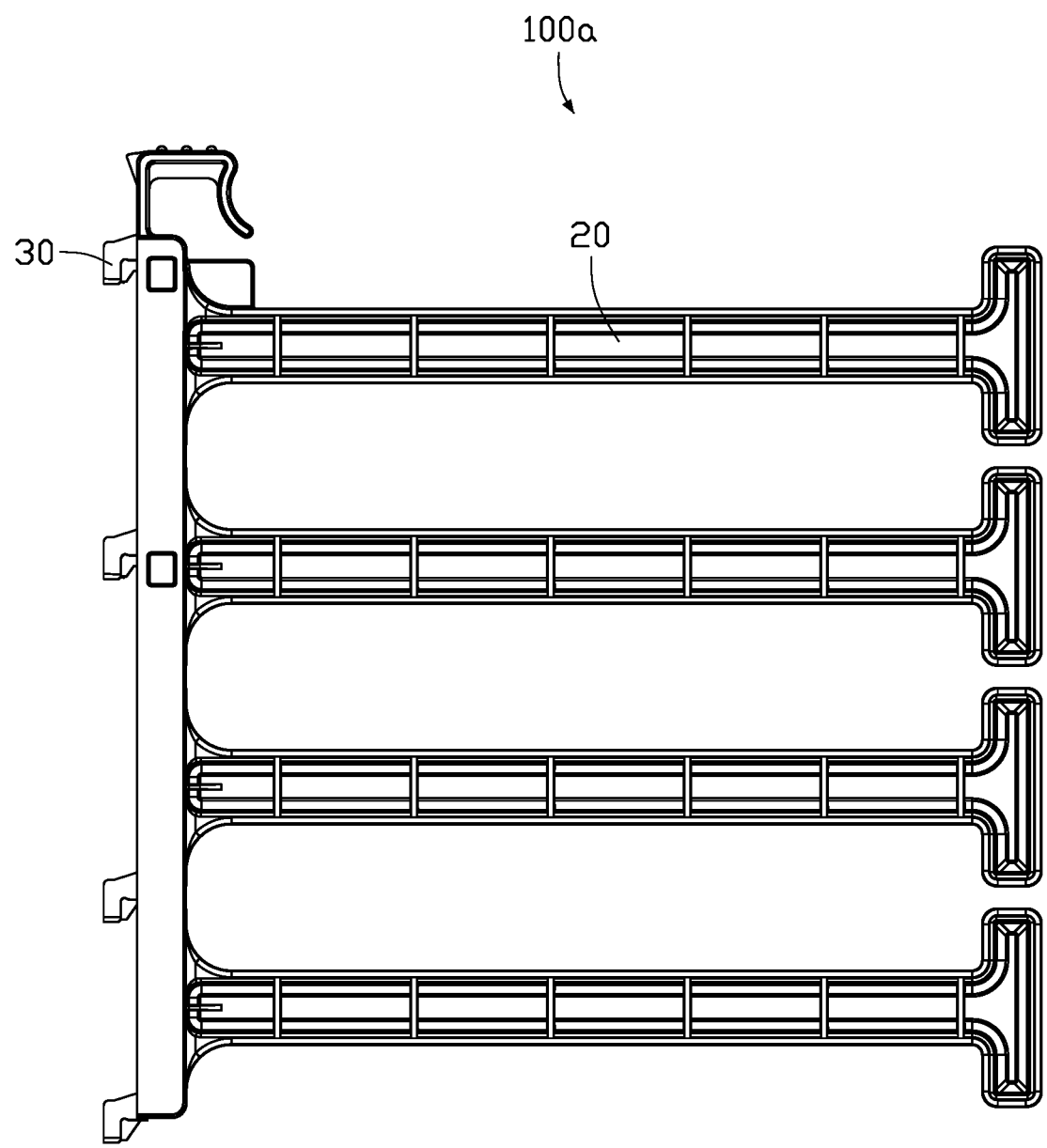
FIG. 5 is a schematic perspective diagram of another embodiment of the cable management frame of the cable management device.

FIG. 5 shows another embodiment of a cable management frame 100a including four brackets 20 and four hooks 30. The number of brackets 20 can be set according to the specifications and types of the wiring harness to be arranged. The number of the hooks 30 is set according to the size of the main body 10 to ensure the strength of the hooks 30 on the support frame 201.

It can be understood that in other embodiments, the number of brackets 20 and hooks 30 of the cable management frame 100 can be different.

The cable management device 200 and the cable management frame 100 are provided with the pressing member 40, and the installation and disassembly of the cable management frame 100 can be completed by pulling or pushing the pressing member 40, making the cable management frame 100 easy to disassemble and assemble. The cable management frame 100 utilizes the hook 30 provided with the reinforcing rib 31 coupled to the main body 10 so that the cable management frame 100 is firmly installed on the support frame 201 to improve the overall support strength of the cable management frame 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A cable management frame comprising:
   a main body;
   a bracket installed on the main body;
   a hook installed on the main body; and
   a pressing member located on an end of the main body;
   wherein:
   the hook and the bracket are located respectively on two sides of the main body; and
   the hook comprises a reinforcing rib coupled to the main body;
   the pressing member comprises a deforming portion and a pressing portion;
   the deforming portion is located on one end of the main body and extends in a direction parallel to the main body; and
   the pressing portion is located on the deforming portion and extends to a side of the deforming portion away from the hook.

2. The cable management device of claim 1, wherein:
   the hook comprises an extension portion and a first holding portion;
   one end of the extension portion is located on the main body, and another end of the extension portion extends away from the main body;
   the first holding portion extends from the end of the extension portion away from the main body;
   the reinforcing rib comprises a first rib; and
   the first rib is coupled to the extension portion, the first holding portion, and the main body.

3. The cable management device of claim 2, wherein:
the first rib is located at a symmetric center of the first holding portion.
4. The cable management device of claim 2, wherein:
the reinforcing rib further comprises a plurality of second ribs; and
the plurality of second ribs is symmetrically arranged on a side of the extension portion away from the first rib and coupled to the main body.
5. The cable management device of claim 1, wherein:
the pressing member further comprises a stopping portion located on the pressing portion and extending to one side of the pressing portion;
a protruding portion is provided on a side of the main body facing away from the hook; and
when the deforming portion is deformed, the stopping portion is stopped by the protruding portion.
6. The cable management device of claim 1, wherein:
a plurality of protrusions is provided on the pressing portion.
7. A cable management device comprising:
a support frame; and
a cable management frame installed on the support frame, the cable management frame comprising:
a main body;
a bracket installed on the main body;
a hook installed on the main body; and
a pressing member located on an end of the main body; wherein:
the hook and the bracket are located respectively on two sides of the main body; and
the hook comprises a reinforcing rib coupled to the main body;
the pressing member comprises a deforming portion and a pressing portion;
the deforming portion is located on one end of the main body and extends in a direction parallel to the main body; and
the pressing portion is located on the deforming portion and extends to a side of the deforming portion away from the hook.

8. The cable management device of claim 7, wherein:
the hook comprises an extension portion and a first holding portion;
one end of the extension portion is located on the main body, and another end of the extension portion extends away from the main body;
the first holding portion extends from the end of the extension portion away from the main body;
the reinforcing rib comprises a first rib; and
the first rib is coupled to the extension portion, the first holding portion, and the main body.
9. The cable management device of claim 8, wherein:
the first rib is located at a symmetric center of the first holding portion.
10. The cable management device of claim 9, wherein:
the reinforcing rib further comprises a plurality of second ribs; and
the plurality of second ribs is symmetrically arranged on a side of the extension portion away from the first rib and coupled to the main body.
11. The cable management device of claim 7, wherein:
the pressing member further comprises a stopping portion located on the pressing portion and extending to one side of the pressing portion;
a protruding portion is provided on a side of the main body facing away from the hook; and
when the deforming portion is deformed, the stopping portion is stopped by the protruding portion.
12. The cable management device of claim 11, wherein:
a plurality of protrusions is provided on the pressing portion.
13. The cable management device of claim 12, wherein:
the support frame defines an engaging hole and a clearance hole communicating with the engaging hole;
the hook is configured to be held in the engaging hole; and
the clearance hole is configured to accommodate the reinforcing rib.
14. The cable management device of claim 13, wherein:
the pressing member is provided with a second holding portion facing the support frame;
the support frame defines a second engaging hole; and
the second holding portion is configured to be clamped in the second engaging hole.

* * * * *